United States Patent
Kim (10) Patent No.: US 7,795,151 B2
(45) Date of Patent: Sep. 14, 2010

(54) METHODS OF FORMING A TRENCH HAVING SIDE SURFACES INCLUDING A UNIFORM SLOPE

(75) Inventor: Ki-Chul Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 736 days.

(21) Appl. No.: 11/624,410

(22) Filed: Jan. 18, 2007

(65) Prior Publication Data

US 2007/0178663 A1    Aug. 2, 2007

(30) Foreign Application Priority Data

Jan. 31, 2006   (KR) .................... 10-2006-0009369

(51) Int. Cl.
*H01L 21/311* (2006.01)
(52) U.S. Cl. ................ 438/700; 257/E21.218
(58) Field of Classification Search ........ 438/700, 438/701, 704, 706, 710, 713, 714, 717, 725; 257/E21.218, E21.311
See application file for complete search history.

(56) References Cited

U.S. PATENT DOCUMENTS

| 6,130,166 A * | 10/2000 | Yeh .......................... 438/710 |
| 6,432,832 B1 * | 8/2002 | Miller et al. ................ 438/713 |
| 6,566,270 B1 * | 5/2003 | Liu et al. .................... 438/706 |
| 7,157,351 B2 * | 1/2007 | Cheng et al. ................ 438/435 |

FOREIGN PATENT DOCUMENTS

| JP | 9-64020 A | 3/1997 |
| KR | 10-0230384 B1 | 8/1999 |
| KR | 2000-0008735 A | 2/2000 |
| KR | 2001-0005210 A | 1/2001 |
| KR | 10-2005-0050180 A | 5/2005 |
| KR | 10-2005-0054363 A | 6/2005 |

* cited by examiner

*Primary Examiner*—David Vu
(74) *Attorney, Agent, or Firm*—Myers Bigel Sibley & Sajovec, PA (57) ABSTRACT

Provided herein are methods of forming a trench including forming a mask layer on a substrate, forming a mask pattern to expose the substrate, using plasma to at least partially remove by-products produced during formation of the mask pattern; and etching the exposed substrate to form a trench having side surfaces including a uniform slope.

23 Claims, 6 Drawing Sheets

METHODS OF FORMING A TRENCH HAVING SIDE SURFACES INCLUDING A UNIFORM SLOPE

CROSS-REFERENCE TO RELATED APPLICATIONS

This patent application claims priority to Korean Patent Application No. 10-2006-9369, filed Jan. 31, 2006, the disclosure of which is hereby incorporated by reference in its entirety.

FIELD OF THE INVENTION

Embodiments of the present invention relate to methods of forming a trench in a substrate.

BACKGROUND OF THE INVENTION

Examples of a device isolation method for a semiconductor device include a local oxidation of silicon (LOCOS) method and a trench isolation method. The LOCOS method may be employed by electrically isolating devices using selective oxidation. The trench isolation method may be employed by electrically isolating devices using trenches.

The LOCOS method has been used in the manufacture of semiconductor devices. In the LOCOS method, a thermal oxidation process is performed on a partially exposed semiconductor substrate to form a field oxide layer. Although the LOCOS method may be uncomplicated to implement, there can be several drawbacks of the LOCOS method. For example, using the LOCOS method, a punch-through may occur because of, for example, either a bird's beak or a thin field oxide layer. In addition, when the semiconductor device is highly integrated, the width of the device isolation region may be reduced and consequently, it may be difficult to isolate the devices using the LOCOS method.

The trench isolation method is designed to overcome at least some of the drawbacks of the LOCOS method. The trench isolation method can include forming trenches in a semiconductor substrate and performing a chemical vapor deposition (CVD) process to fill the trenches with an insulating material. Compared to the LOCOS method, the trench isolation method may provide an effective device isolation depth for an isolation region with the same width. However, using the trench isolation method, the width of the device isolation region (i.e., the width of a trench) may be reduced due to the high integration of semiconductor devices. Thus, it may be more difficult to fill the device isolation region with an insulating material.

FIGS. 1A through 1E present sectional views illustrating a conventional method of forming a trench in a semiconductor substrate.

Figure 1A:
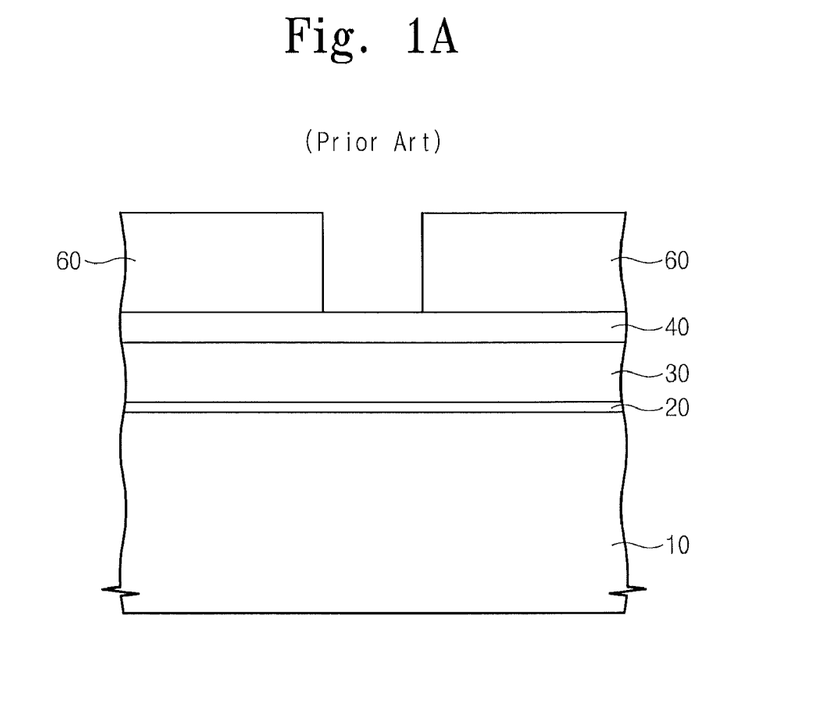
FIGS. 1A through 1E present sectional views illustrating a conventional method of forming a trench in a semiconductor substrate.

Referring to FIG. 1A, a pad oxide layer 20, a nitride layer 30, and an anti-reflective layer 40 are formed on the semiconductor substrate 10. A photoresist pattern 60 is formed above the anti-reflective layer 40 to define a trench region.

Figure 1B:
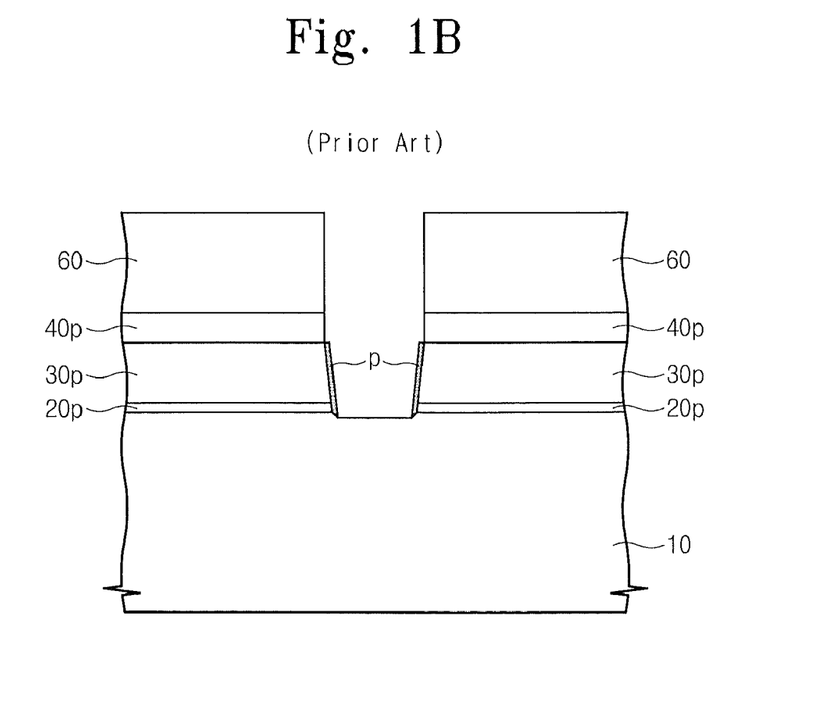

Referring to FIG. 1B, an etching process is performed on the structure in FIG. 1A to form an anti-reflective layer pattern 40p, a nitride layer pattern 30p and a pad oxide layer pattern 20p and to further expose a portion of the semiconductor substrate 10. A polymer P layer may be formed on the sidewalls of the nitride layer pattern 30p and the pad oxide layer pattern 20p.

Figure 1C:
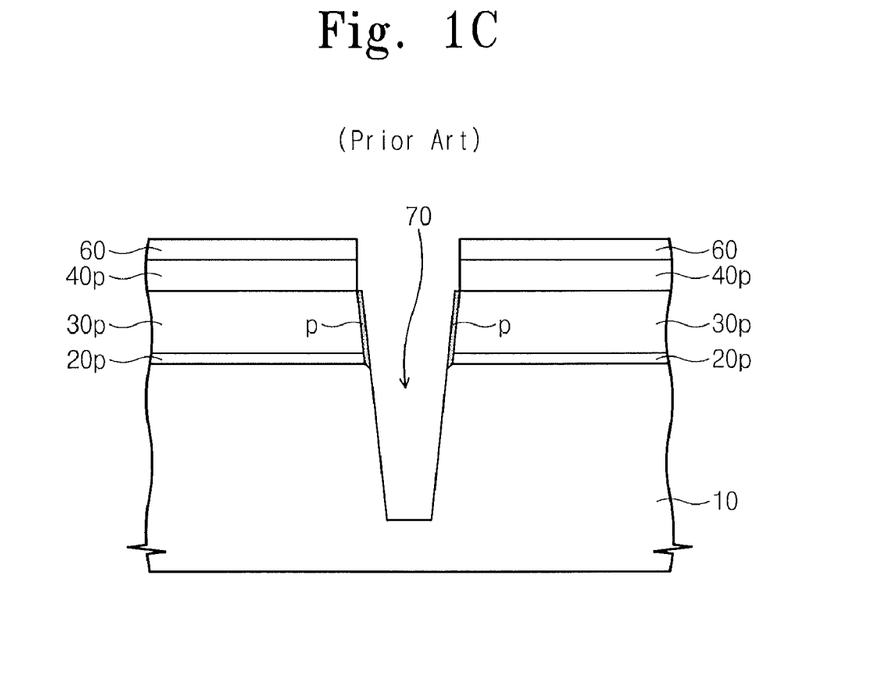
Figure 1D:
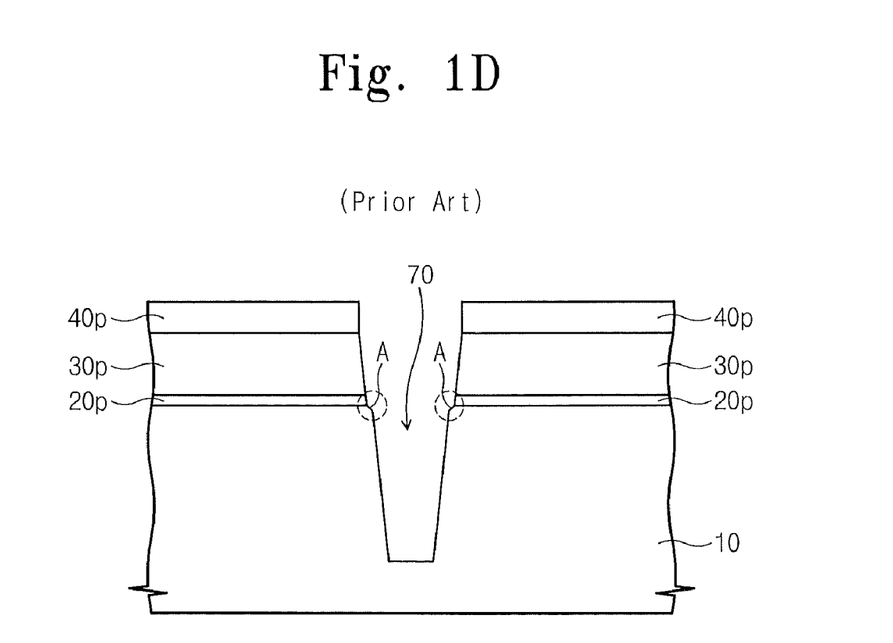

Referring to FIGS. 1C and 1D, an etching process is performed again on the structure in FIG. 1B to form a trench 70. When the etching process is performed the second time, the polymer P may serve as an etch mask. After the etching process, an ashing process is performed to remove the photoresist pattern 60 and the polymer P. After the polymer P is removed, a ledge A may be formed at a rounded top edge of the trench 70 as illustrated in FIG. 1D.

Figure 1E:
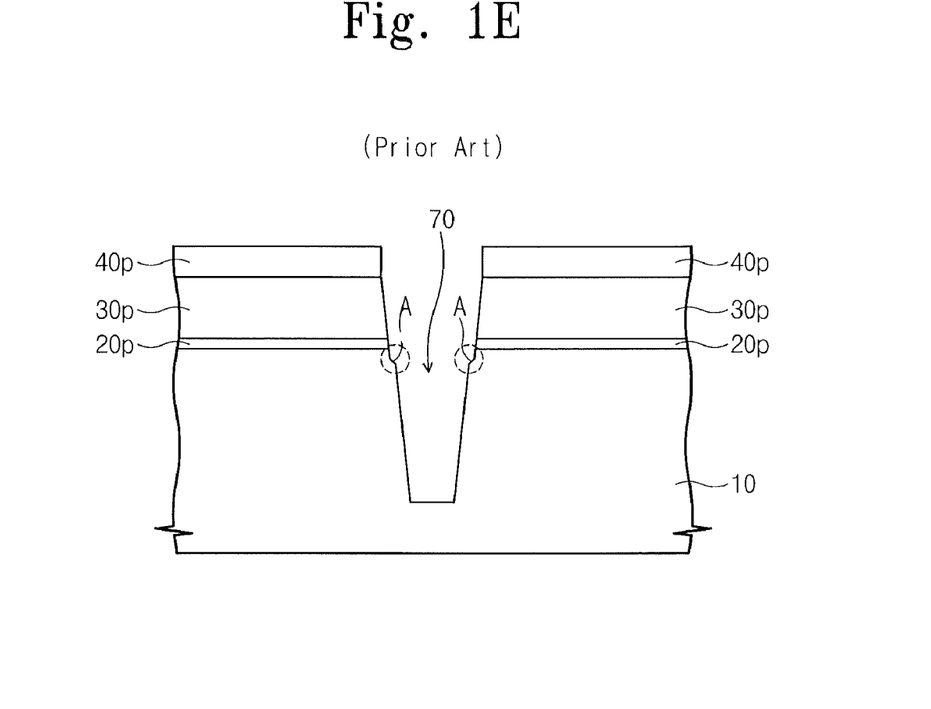

If over-etching occurs on the nitride layer pattern 30p and the pad oxide layer pattern 20p, the ledge A may be formed at a lower position as illustrated in FIG. 1E.

If the side surfaces of the trench 70 are uneven (i.e., if the side surfaces have an uneven slope) as illustrated in FIGS. 1D and 1E, the trench 70 may be partially filled at most with an insulating material. For example, when the trench 70 is filled with an insulating material, voids can be generated in a center portion of the trench 70 because, at least in part, of abnormal deposition of an insulating layer on the ledge A. This phenomenon may occur more frequently when the integration degree of a semiconductor device increases and/or the trench width decreases.

SUMMARY OF THE INVENTION

According to some embodiments of the present invention, methods of forming a trench in a substrate include forming a mask layer on a substrate; forming a mask pattern to expose the substrate; using plasma to at least partially remove a by-product produced during formation of the mask pattern; and etching the exposed substrate to form a trench having side surfaces including a uniform slope. In some embodiments, the by products are substantially removed during formation of the mask pattern.

In some embodiments, the plasma includes oxygen, nitrogen, an inert gas, and/or a combination thereof, but does not include a fluorine-containing gas. In some embodiments, the plasma is selected on the basis of the size of the trench and/or the thickness of the by-product to be removed.

In some embodiments, the mask layer includes a nitride layer and an anti-reflective layer. In some embodiments, formation of the mask pattern and etching the exposed substrate to form a trench is performed using a dry etching process including plasma.

In some embodiments, a bias power applied to at least partially remove the by-product is lower than a bias power applied during formation of the mask pattern and etching the exposed surface to form the trench. In some embodiments, a bias power applied to at least partially remove the by-product determines a vertical etch rate of the by-product. In some embodiments, a source power applied to at least partially remove the by-product is lower than a source power applied during formation of the mask pattern and etching the exposed surface to form the trench.

In some embodiments, the method of forming a trench may further include at least partially gap filling the trench with an insulating material. In some embodiments, the trench may be substantially gap-filled.

According to some embodiments of the present invention, methods of forming a trench in a substrate include forming a mask layer on a substrate; forming a mask pattern to expose the substrate; removing a native oxide layer formed on the exposed surface further include at least some surface pollutants; using a plasma to at least partially remove a by-product produced during formation of the mask pattern; and etching the exposed substrate to form a trench having side surfaces including a uniform slope.

In some embodiments, removing the native oxide and at least some of the surface pollutants include using plasma. In some embodiments, the plasma used to remove the native oxide and surface pollutants includes oxygen gas, a fluorine containing gas, an inert gas and/or a combination thereof.

According to some embodiments, a trench may be uniformly filled with an insulating material and/or an isolation layer, which may result in a reduction in the formation of defects.

BRIEF DESCRIPTION OF THE DRAWINGS

The above and other aspects of the present invention will become readily apparent by reference to the following detailed description when considering such in conjunction with the accompanying drawings, in which.

The present invention will now be described more fully hereinafter with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

DETAILED DESCRIPTION

The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise. Also, as used herein, "and/or" refers to and encompasses any and all possible combinations of one or more of the associated listed items.

Unless otherwise defined, all terms, including technical and scientific terms used in this description, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

In the drawings, the thickness of layers and regions are exaggerated for clarity. It will also be understood that when a layer is referred to as being "on" another layer or substrate or a reactant is referred to as being introduced, exposed or feed "onto" another layer or substrate, it can be directly on the other layer or substrate, or intervening layers can also be present. However, when a layer, region or reactant is described as being "directly on" or introduced, exposed or feed "directly onto" another layer or region, no intervening layers or regions are present. Additionally, like numbers refer to like compositions or elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the present invention are further described herein with reference to cross-section illustrations that are schematic illustrations of idealized embodiments of the present invention. As such, variations from the shapes of the illustrations as a result, for example, of manufacturing techniques and/or tolerances, are to be expected. In particular, the regions illustrated in the figures are schematic in nature and their shapes are not intended to illustrate the precise shape of a region of a device and are not intended to limit the scope of the present invention.

As will be appreciated by one of ordinary skill in the art, the present invention may be embodied as compositions and devices including the compositions as well as methods of making and using such compositions and devices.

FIGS. 2A through 2F present sectional views illustrating a method of forming a trench in a semiconductor substrate according to some embodiments of the present invention.

Figure 2A:
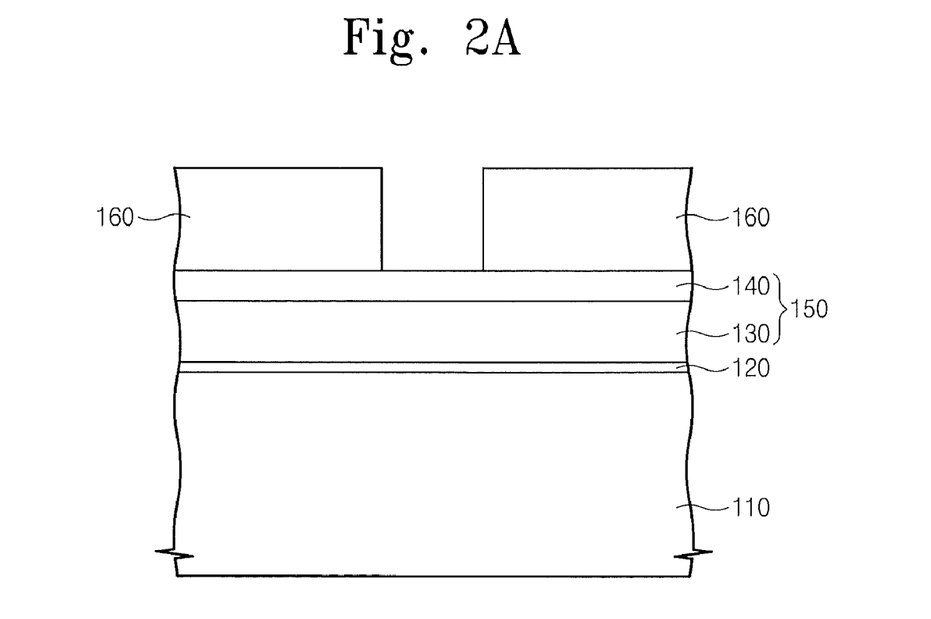
FIGS. 2A through 2F present sectional views illustrating a method of forming a trench in a semiconductor substrate according to some embodiments of the present invention.

Referring to FIG. 2A, a pad oxide layer 120, a mask layer 150, and a photoresist film pattern 160 may be formed on a semiconductor substrate 110. The mask layer 150 may include a nitride layer 130 and an anti-reflective layer 140. The mask layer 150 may further include a variety of layers (e.g., an oxide layer and/or a polysilicon layer). The additional layers may be included based on the characteristics of the trench to be formed.

According to embodiments of the present invention, the semiconductor substrate 110 may be any suitable type of substrate such as a semiconductor substrate. For example, the semiconductor substrate 110 may be a monocrystalline bulk silicon substrate, a P-type semiconductor substrate implanted with P-type impurities such as boron (B), or any other type of suitable substrates, and/or a combination thereof.

The pad oxide layer 120 may be formed using a thin film forming process well known to those skilled in the art. The pad oxide layer 120 may be interposed between the semiconductor substrate 110 and the nitride layer 130, and the pad oxide layer 120 may serve as a buffer to reduce the stress applied to the semiconductor substrate 110 when the nitride layer 130 is formed.

The nitride layer 130 may be formed using a thin film forming process well known to those skilled in the art. After the trench in the semiconductor substrate 110 is filled with an insulating material, the nitride layer 130 can serve as a polishing stop layer when a chemical mechanical polishing (CMP) process is performed. In some embodiments, the nitride layer 130 is formed to a thickness of about 850 Å or more such that the nitride layer 130 can serve as the polishing stop layer.

The anti-reflective layer 140 may be SiN, SiON or any other suitable substrate and or a combination thereof and the anti-reflective layer 140 may be formed using a thin film forming process well known to those skilled in the art. The anti-reflective layer 140 may prevent irregular light reflection during a subsequent photolithography process (e.g., an exposure process for forming a photoresist pattern).

The photoresist pattern 160 may be formed using a thin film forming process and a photolithography process well known to those skilled in the art. For example, the process of forming the photoresist pattern 160 may include forming an organic photoresist layer on the anti-reflective layer 140 by using a spin coating process and then performing a photolithography process (e.g., an exposure process and a development process) on the resulting structure with the organic photoresist layer. A trench region may be defined by the photoresist pattern 160.

Figure 2B:
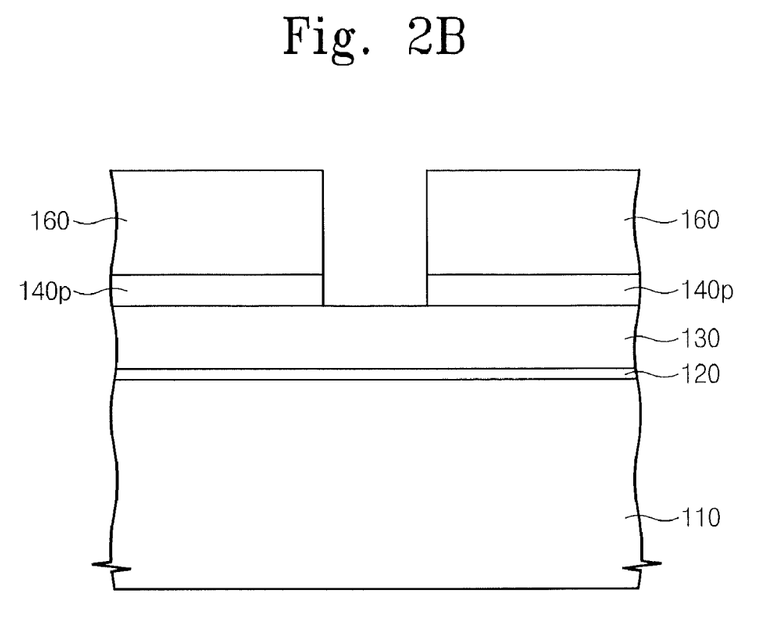

Referring to FIG. 2B, an etching process may be performed on the resulting structure in FIG. 2A to form an anti-reflective layer pattern 140p. The etching process may be a dry etching process using plasma. In some embodiments, the conditions of the etching process may be described as follows. A process gas including oxygen gas ($O_2$) and $CF_4$ may be used, and their flow rates may be about 3 sccm and about 55 sccm, respectively. A source power may be about 250 W and a bias power may be about 75 W. The source power may be supplied by a source power supply over a process chamber (not shown in the FIG. 2B). The bias power may be supplied by a bias power supply located under the process chamber to the semiconductor substrate 110. The pressure of the process chamber may be about 8 mT and the process time (i.e., etching time) may be about 49.5 seconds.

When the anti-reflective layer 140 is etched to form the anti-reflective layer pattern 140p, a portion of the photoresist pattern 160 may be etched as well.

Figure 2C:
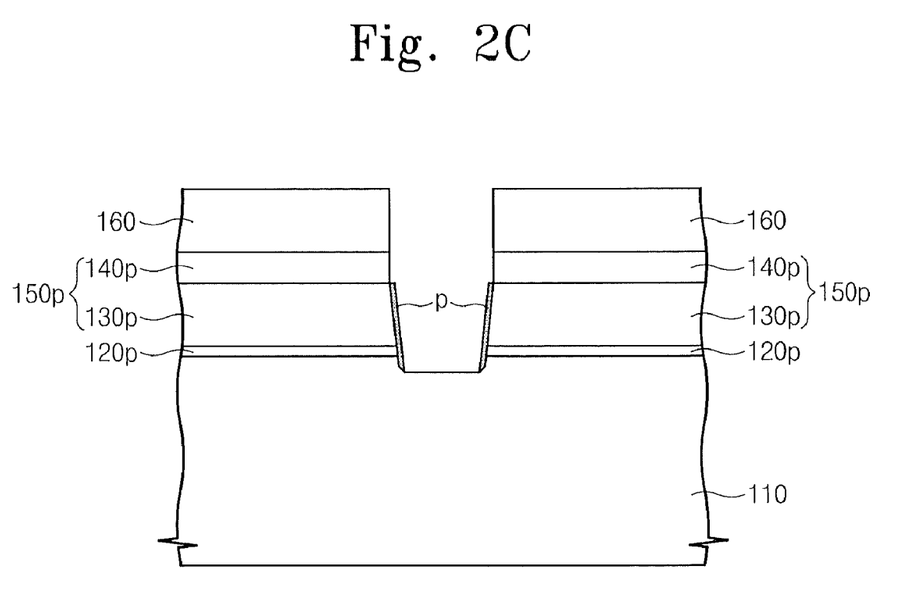

Referring to FIG. 2C, an etching process may be performed on the resulting structure of FIG. 2B to form a nitride layer pattern 130p and a pad oxide layer pattern 120p and to further expose a portion of the semiconductor substrate 110. During the etching process, the exposed portion of the semiconductor substrate 110 may be over etched. The anti-reflective layer pattern 140p and the nitride layer pattern 130p may constitute a mask pattern 150p. A polymer P, a by-product of the etching process, may be formed on the sidewalls of the nitride layer pattern 130p, the pad oxide layer pattern 120p, and/or the exposed semiconductor substrate 110. The etching process may be a dry etching process using plasma. In some embodiments, the conditions for the etching process may be described as follows. A process gas including $CHF_3$ and $CF_4$ may be used, and their flow rates may be about 100 sccm and about 260 sccm, respectively. The source power may be about 550 W and the bias power may be about 200 W. The pressure of the process chamber may be about 135 mT and the process time (i.e., etching time) may be about 96 seconds. The source power of the etching process may determine the etch rate of the nitride layer 130. Thus, when the source power is too low, the nitride layer pattern 130p may not be smoothly formed due to a low etch rate of the nitride layer 130. Therefore, in some embodiments, the source power may be higher than or equal to about 500 W.

During the formation of the nitride layer pattern 130p and the pad oxide layer pattern 120p, the thickness of the photoresist pattern 160 may be reduced because at least some portion of the photoresist pattern 160 may be etched as well.

Figure 2D:
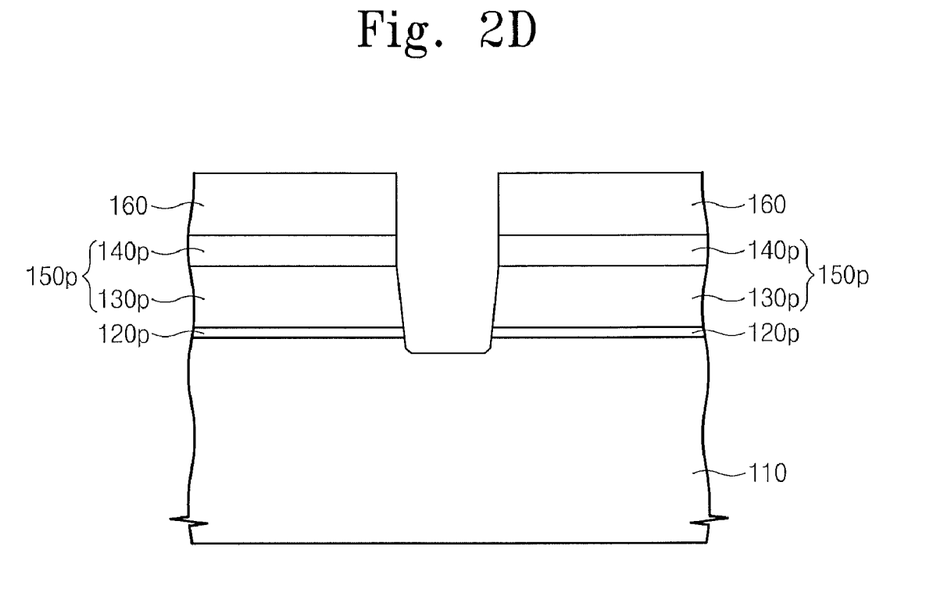

Referring to FIG. 2D, the exposed surface of the semiconductor 110 is plasma-processed to remove a native oxide layer formed on the exposed surface (not shown in FIG. 2D). In addition to the native oxide layer, the plasma process may also remove some surface pollutants such as silicon oxide nitride, which may cause etch defects by, at least in part, acting as a micro mask in the subsequent processes. After the plasma process is performed on the exposed surface of the semiconductor 110, the region where the trench is to be formed is cleaned before forming the trench. Therefore, the subsequent etching process may achieve uniformity. This cleaning process may be referred to as a breakthrough process.

The conditions for the cleaning process (breakthrough) may be described as follows. A process gas may include an oxygen gas ($O_2$), a fluorine containing gas (e.g., $CF_4$), an inert gas (e.g., He), and/or a combination thereof, and their flow rates may be about 26 sccm, about 134 sccm, and about 200 sccm, respectively. The source power may be about 650 W and the bias power may be about 220 W. The pressure of the process chamber may be about 10 mT and the process time (i.e., etching time) may be about 4 seconds. Since the cleaning process is performed to clean the silicon surface, the process time of the cleaning process may be decreased. Therefore, in some embodiments, the source power may be high enough to remove the native oxide layer or the silicon oxide nitride from the silicon surface within a short period of time.

Subsequently, plasma may be used to remove the polymer P on the sidewalls of the nitride layer pattern 130p, the pad oxide layer pattern 120p, and/or the exposed semiconductor substrate 110. The conditions for removing the polymer may be described as follows. A gas used to form the plasma may include oxygen gas ($O_2$) and its flow rate may be about 150 sccm. The source power may be about 300 W and the bias power may be about 50 W. The pressure of the process chamber may be about 80 mT and the process time (etching time) may be about 10 seconds.

In addition to oxygen gas, the gas forming the plasma may include oxygen gas, nitrogen gas, an inert gas (e.g., He or Argon), and/or a combination thereof. When only oxygen gas is used to form the plasma, the removal rate of the polymer P may be increased; however, the sidewalls of the mask pattern 150p may be etched as well. When only nitrogen gas or inert gas is used to form the plasma, the polymer P may be more precisely removed but the removal rate of the polymer P may be decreased. Thus, the gas forming the plasma may be selected on the basis of the size of the trench and/or the thickness of the polymer P.

The bias power applied to the semiconductor substrate 110 during the polymer removing process may be about 50 W. In some embodiments, the bias power and/or the source power applied during the polymer removal process may be lower than the bias power and/or the source power applied during the etching process of forming the nitride layer pattern 130p and the cleaning process. When the bias power decreases, the removal rate of the polymer P may also decrease. Under the condition of decreased removal rate, the polymer P can be more precisely removed. On the contrary, when the bias power increases, the removal rate of the polymer P may also increase. However, under the condition of increased removal rate, the sidewall of the mask pattern 150p may also be etched. When the sidewall of the mask pattern 150p is etched, the trench formed may be larger than a desired size, which can prevent the high integration of semiconductor devices. A similar theory may also be applied to the source power and the removal rate of the polymer P. When the source power decreases, the removal rate of the polymer P may decrease. Under the condition of the decreased removal rate, the polymer P can be more precisely removed. On the contrary, when the source power increases, the removal rate of the polymer P may increase. However, under the condition of increased removal rate of the polymer P, the sidewall of the mask pattern 150p may also be etched. In this case, the trench formed may be bigger than a desired size, which may prevent the high integration of semiconductor devices. Therefore, in some embodiments, the source power and the bias power may be determined at least on the basis of the desired size of the trench. Since the polymer P is on the sidewalls of the mask pattern 150p, in some embodiments, the bias power rather than the source power may be reduced in order to decrease the vertical etch rate of the polymer P.

In some embodiments, the polymer removal process may be performed before and/or after the cleaning process. Both the polymer removal process and the cleaning process are preliminary processes which may be performed before the etching process to provide the desired size of the trench. Thus, in some embodiments, the process time of both processes may be decreased. Therefore, the source power and the bias power of the polymer removal process are lower than the source power and the bias power of the cleaning process. Additionally, in order to more precisely remove the polymer P, gases which may provide a high etch rate such as a fluorine-containing gas (e.g., $CF_4$) may not be used during the polymer removal process.

Figure 2E:
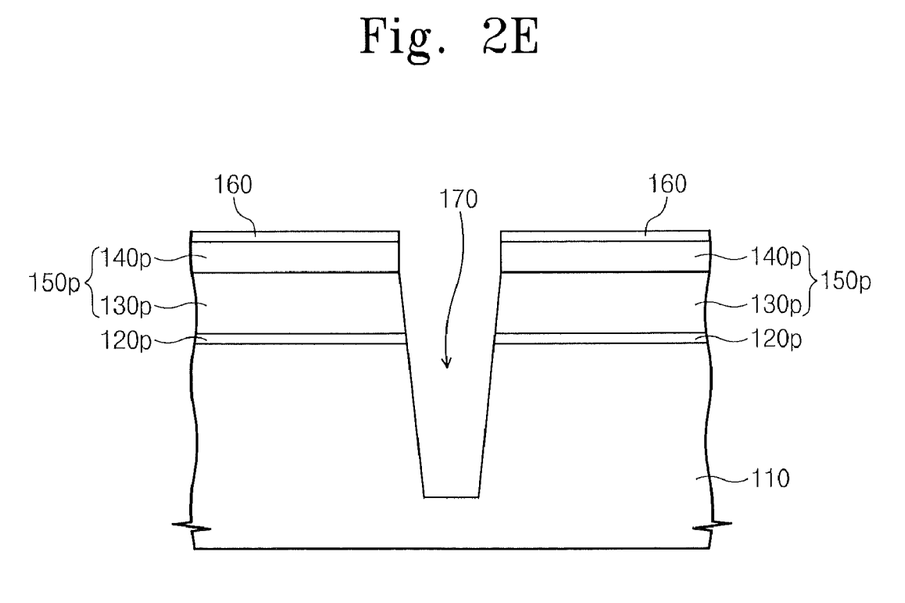

Referring to FIG. 2E, the exposed portion of the semiconductor substrate 110 may be etched to form a trench 170. The etching process may be a dry etching process using plasma. Unlike the conventional trenches such as trench 70 in FIGS. 1D and 1E, the trench 170, according to some embodiments of the present invention, does not have a ledge on its side surface because the polymer P on the sidewalls of the mask pattern 150p has been removed before the formation of the trench 170. Thus, the trench 170 may have a uniform slope on its side surface. Therefore, even when the width of the trench 170 is reduced for the high integration of semiconductor devices, a defect-free isolation layer may still be formed in the trench 170. For example, voids may be avoided while the trench 170 is filled with an insulating material.

The conditions for the etching process of forming the trench 170 may be described as follows. The process gas may include $O_2$ and chloride gas ($Cl_2$), and their flow rates are about 18 sccm and about 90 sccm, respectively. The source power may be about 300 W and the bias power may be about 375 W. The pressure of the process chamber may be about 30 mT and the process time (i.e., etching time) may be about 47 seconds. During the etching process of forming the trench 170, the direction of the etching process may be perpendicular to the semiconductor substrate 110. Therefore, in some embodiments, the bias power may be relatively high.

During the formation of the trench 170, the photoresist pattern 160 may be partially etched, and thus may have a reduced thickness.

Figure 2F:
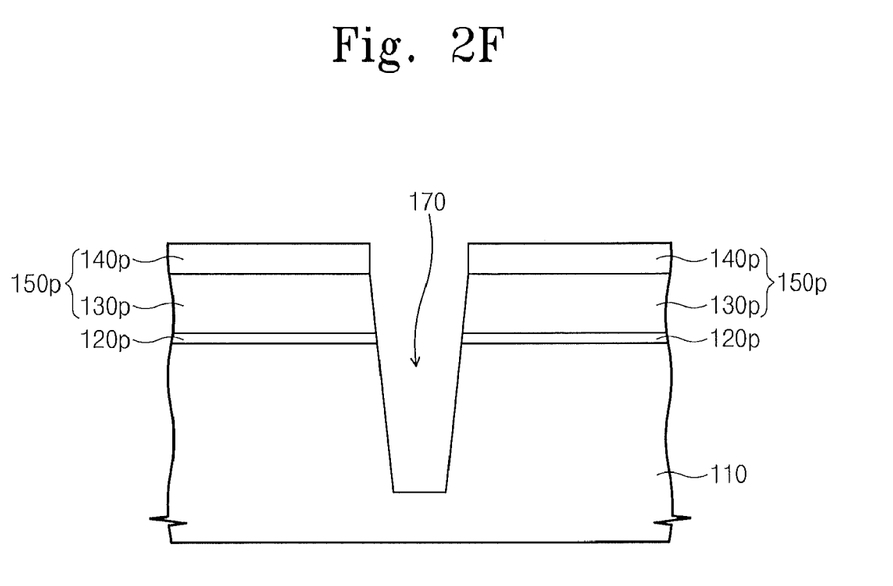

Referring to FIG. 2F, a plasma-based dry cleaning process may be performed to remove the photoresist pattern 160. The plasma-based dry cleaning can also be referred to as an ashing process. The conditions of the ashing process may be described as follows. The process gas may include $O_2$ and its flow rate may be about 150 sccm. The source power may be about 300 W and the bias power may be about 200 W. The pressure of the process chamber may be about 80 mT and the process time may be about 60 seconds.

A thin film forming process well known to those skilled in the art, for example, a high-density plasma chemical vapor deposition (HDP CVD) process may be performed to at least partly fill the trench 170 with an insulating material such as a silicon oxide.

In some embodiments of the present invention, the polymer formed on the sidewalls of the mask pattern used to form the trench may be more precisely removed. Thus, the trench formed may have a more uniform slope on its side surface.

Subsequently, the trench may be smoothly gap-filled with the insulating material including a highly integrated semiconductor device. Accordingly, an isolation layer can be formed without defects such as voids.

The foregoing is illustrative of the present invention and is not to be construed as limiting thereof. Although some embodiments of this invention have been described, one of ordinary skill in the art will readily appreciate that modifications to the embodiments are possible without departing from the teachings of the invention. Accordingly, all such modifications are intended to be included within the scope of this invention as defined in the claims, with equivalents of the claims to be included therein.

What is claimed is:

1. A method of forming a trench in a substrate, comprising:
   forming a mask layer on a substrate;
   forming a mask pattern to expose the substrate;
   treating the substrate and the mask pattern using plasma to at least partially remove a by-product produced during formation of the mask pattern; and
   etching the exposed substrate to form a trench having side surfaces including a uniform slope, wherein the by-product comprises a polymer, and treating the substrate and the mask pattern using plasma comprises at least one step for removing the polymer selectively, and wherein the plasma comprises oxygen, nitrogen, an inert gas, and/or a combination thereof with the proviso that the plasma does not comprise a fluorine-containing gas.

2. The method of claim 1, wherein forming the mask pattern comprises etching the mask layer.

3. The method of claim 1, wherein the mask layer comprises a nitride layer and an anti-reflective layer.

4. The method of claim 1, wherein the plasma is selected on the basis of the size of the trench and/or the thickness of the by-product to be removed.

5. The method of claim 1, wherein forming the mask pattern and etching the exposed substrate to form a trench is performed using a dry etching process including plasma.

6. The method of claim 1, wherein a bias power applied to at least partially remove the by-product is lower than a bias power applied during formation of the mask pattern and etching the exposed surface to form the trench.

7. The method of claim 1, wherein a bias power applied to at least partially remove the by-product determines a vertical etch rate of the by-product.

8. The method of claim 1, wherein a source power applied to at least partially remove the by-product is lower than a source power applied during formation of the mask pattern and etching the exposed surface to form the trench.

9. The method of claim 1 further comprising performing a plasma-based dry cleaning process.

10. The method of claim 1, wherein treating the substrate and the mask pattern using plasma comprises at least two steps wherein a first step is performed using tetrafluoromethane ($CF_4$) and a second step is performed using plasma that is essentially free of fluorine, and the polymer is removed selectively during the second step.

11. A method of forming a trench in a substrate, comprising:

forming a mask layer on a substrate;

forming a mask pattern to expose the substrate;

at least partially removing a native oxide layer formed on the exposed surface and/or at least some surface pollutants on the exposed surface;

treating the substrate and the mask pattern using plasma to at least partially remove a by-product produced during formation of the mask pattern; and etching the exposed substrate to form a trench having side surfaces including a uniform slope, wherein the by-product comprises a polymer, and treating the substrate and the mask pattern using plasma comprises at least one step for removing the polymer selectively, and wherein the plasma comprises oxygen, nitrogen, an inert gas, and/or a combination thereof with the proviso that the plasma does not comprise a fluorine-containing gas.

12. The method of claim 11, wherein at least partially removing the native oxide layer and at least some of the surface pollutants comprises using plasma.

13. The method of claim 12, wherein the plasma comprises oxygen gas, a fluorine containing gas, an inert gas and/or a combination thereof.

14. The method of claim 11, wherein forming the mask pattern comprises etching the mask layer.

15. The method of claim 11, wherein the plasma comprises oxygen, nitrogen, an inert gas, and/or a combination thereof.

16. The method of claim 11, with the proviso that the plasma does not comprise a fluorine-containing gas.

17. The method of claim 11, wherein the mask layer comprises a nitride layer and an anti-reflective layer.

18. The method of claim 11, wherein the plasma is selected on the basis of the size of the trench and/or the thickness of the by-product to be removed.

19. The method of claim 11, wherein forming the mask pattern and etching the exposed substrate is performed using a dry etching process including plasma.

20. The method of claim 11, wherein a bias power applied to at least partially remove the by-product is lower than a bias power applied during formation of the mask pattern and etching the exposed surface to form the trench.

21. The method of claim 11, wherein a bias power applied to at least partially remove the by-product determines a vertical etch rate of the by-product.

22. The method of claim 11, wherein a source power applied to at least partially remove the by-product is lower than a source power applied during formation of the mask pattern and etching the exposed surface to form the trench.

23. The method of claim 11 further comprising performing a plasma-based dry cleaning process.

* * * * *